United States Patent [19]
Kato et al.

[11] Patent Number: 4,746,895
[45] Date of Patent: May 24, 1988

[54] CERAMIC ELECTRONIC COMPONENTS

[75] Inventors: Toshikazu Kato; Koichi Nitta, both of Yokaichi, Japan

[73] Assignee: Murata Mfg. Co., Ltd., Japan

[21] Appl. No.: 931,792

[22] Filed: Nov. 18, 1986

[30] Foreign Application Priority Data

Nov. 29, 1985 [JP] Japan .................. 60-270182

[51] Int. Cl.⁴ .............................................. H01C 1/02
[52] U.S. Cl. ...................................... 338/272; 338/275; 338/332
[58] Field of Search .............. 338/272, 273, 274, 322, 338/332

[56] References Cited

U.S. PATENT DOCUMENTS

| 1,787,745 | 1/1931 | Heyroth | 338/272 X |
| 1,877,352 | 9/1932 | Megow | 338/272 X |
| 2,635,162 | 4/1953 | Kohring | 338/274 X |
| 3,803,528 | 4/1974 | Wellard | 338/257 |

Primary Examiner—C. L. Albritton
Attorney, Agent, or Firm—Ostrolenk, Faber, Gerb & Soffen

[57] ABSTRACT

A ceramic electronic component which comprises a generally elongated ceramic body and a metal cap mounted on each end of the ceramic body. Each end of the ceramic body has a peripheral edge rounded to have a predetermined first radius of rounding, and the metal cap has an interior corner rounded to have a predetermined second radius of rounding. The first radius of rounding is greater than the second radius of rounding.

7 Claims, 2 Drawing Sheets

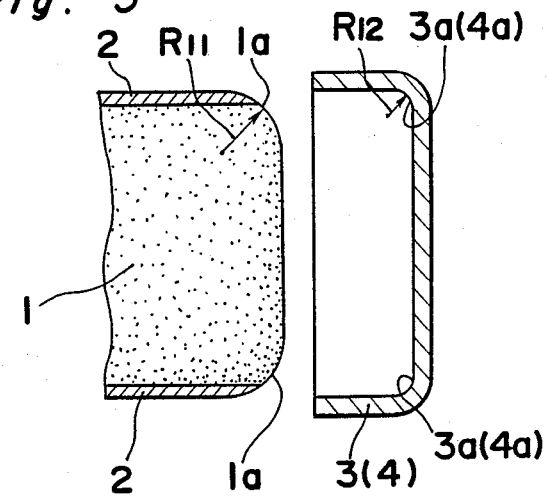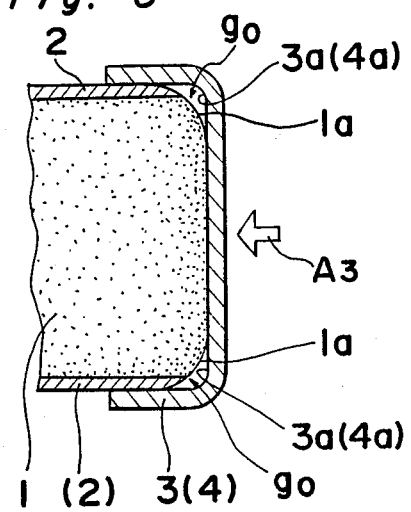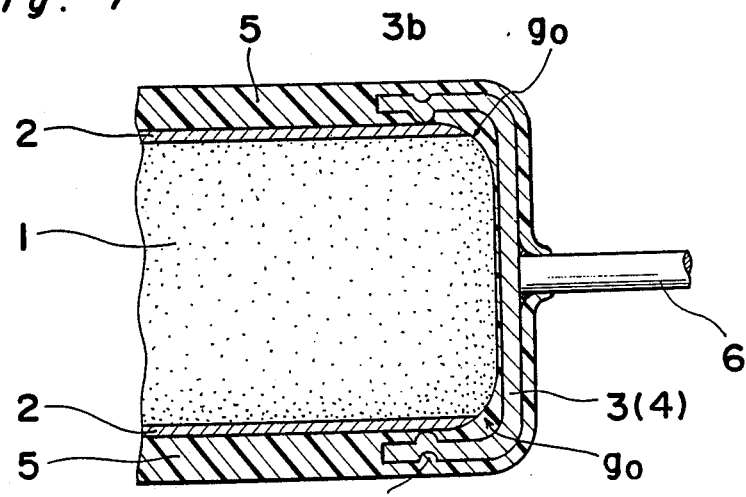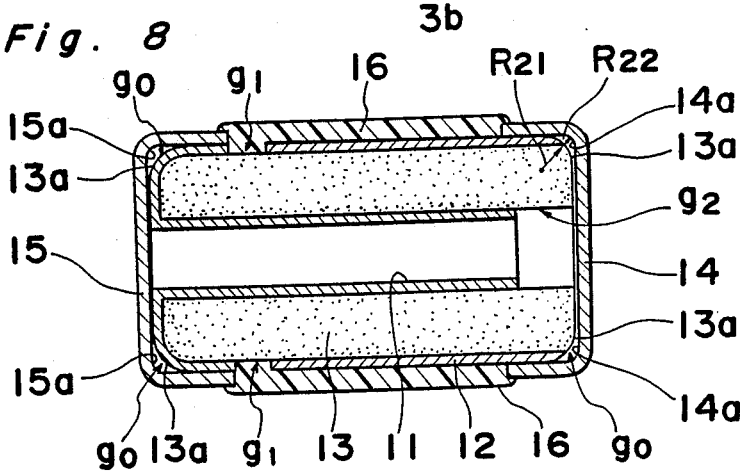

CERAMIC ELECTRONIC COMPONENTS

BACKGROUND OF THE INVENTION

1. Field of Technology

The present invention generally relates to electronic components made of ceramic material and, more particularly, to a generally elongated ceramic electronic component such as, for example, a capacitor or a resistor, of a type having a metal cap mounted on each end thereof.

2. Description of the Prior Art

A ceramic electronic component of a generally elongated configuration, for example, a cylindrical ceramic electronic component, having its opposite ends mounted with respective metal caps has long been used and is well known in the art. By way of example, FIG. 1 illustrates a prior art resistor comprising a generally cylindrical ceramic body 1 having a resistance layer 2 deposited on the peripheral surface thereof, and metal caps 3 and 4 mounted on opposite ends of the ceramic body 1. The metal caps 3 and 4 so mounted are electrically connected with the opposite ends of the resistance layer 2 through respective lead-out electrodes (not shown), the assembly being in turn lined with a resin coating 5 which shields only the resistance layer 2 from the outside while permitting the metal caps 3 and 4 to be substantially exposed to the outside. The metal caps 3 and 4 serve as terminals of the cylindrical chip resistor, and an electric resistance can be obtained across these metal caps 3 and 4.

In the manufacture of the cylindrical chip resistor of the construction shown in FIG. 1, in order to avoid any possible chipping or cracking which would occur at a peripheral edge of each end of the ceramic body 1, the peripheral edge 1a of each end of the ceramic body 1 is rounded to have a predetermined radius $R_1$ as shown in FIG. 2. Similarly, the interior corner 3a and 4a of each metal cap 3 and 4 is rounded to have a predetermined radius $R_2$. According to the prior art, the radius $R_1$ of rounding at the peripheral edge 1a of each end of the ceramic body 1 is smaller than the radius $R_2$ of rounding at the interior corner 3a or 4a of each metal cap 3 or 4, although FIG. 2, as well as FIG. 3, illustrates only one end of the ceramic body 1 and its associated metal cap 3.

As best shown in FIG. 3, when the metal cap 3 or 4 has been, or is, mounted on the corresponding end of the ceramic body 1, and when the metal cap 3 is pushed towards the ceramic body 1 by the application of an external pushing force $A_1$ acting in a direction generally axially of the ceramic body 1, the peripheral edge 1a of the end of the ceramic body 1 is brought into abutment with an inner wall face of the mounted metal cap 3 with the consequence that, because the radius $R_1$ of rounding is smaller than the the radius $R_2$ of rounding, a cylindrical wall portion of the metal cap 3 is flared radially outwardly as shown by the arrow $A_2$. Therefore, the prior art chip resistor has a problem in that one or both of the metal caps 3 and 4 cannot be firmly mounted on the respective ends of the ceramic body 1 and are, therefore, easy to separate therefrom.

SUMMARY OF THE INVENTION

Accordingly, the present invention has for its essential object to provide an improved ceramic electronic component comprising a generally elongated ceramic body having end caps firmly mounted on the opposite ends thereof.

To this end, the present invention is featured in that the radius of rounding at the peripheral edge of each end of the ceramic body is made greater than that at the interior corner of each end cap. This feature makes it possible to avoid any possible contact of each rounded peripheral edge of the opposite ends of the ceramic body with the inner wall face of the respective end cap, thereby to eliminate the possible flaring of the peripheral wall portion of each of the end caps.

According to the present invention, since no contact takes place between the rounded peripheral edge of each end of the ceramic body and the inner wall face of the respective end cap, there is no possibility that, during the mounting of each end cap, the end cap may be outwardly flared at the opening thereof and, therefore, the end cap can be firmly mounted on the associated end of the generally elongated ceramic body. Also, according to the present invention, there is also no possibility that one or both of the end caps may be separated from the ceramic body while the ceramic electronic component is being handled. Moreover, the ceramic electronic component according to the present invention can be fabricated reliable according to designed dimensions.

BRIEF DESCRIPTION OF THE DRAWINGS

This object and other objects and features of the present invention will become clear from the following description of preferred embodiments thereof with reference to the accompanying drawings, in which:

FIGS. 4 to 6 are views similar to FIGS. 1 to 3, respectively, showing a ceramic resistor according to one embodiment of the present invention;

FIG. 7 is a view similar to FIG. 3, showing a modified form of the embodiment shown in FIGS. 4 to 6; and FIG. 8 is a view similar to FIG. 1, showing the present invention as applied to a generally elongated chip capacitor.

DETAILED DESCRIPTION OF THE EMBODIMENTS

Figure 1:
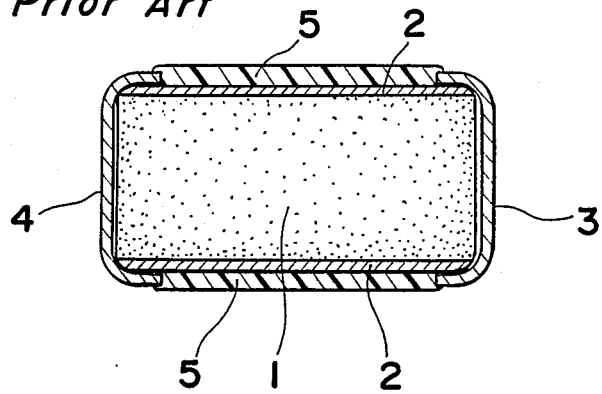
FIG. 1 is a longitudinal sectional view of the prior art ceramic resistor.

Before the description of the present invention proceeds, it is to be noted that like parts are designated by like reference numerals throughout the accompanying drawings.

Figure 4:
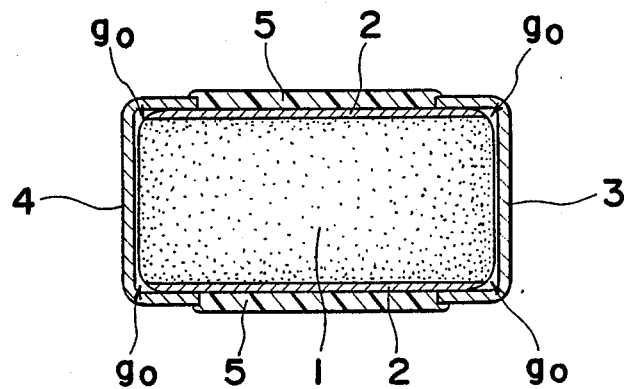

Referring now to FIGS. 4 to 6, and as best shown in FIG. 5, each end of the cylindrical solid ceramic body 1 having its peripheral surface deposited with the resistance layer 2 has its peripheral edge 1a rounded to have a predetermined radius $R_{11}$ of rounding. On the other hand, each metal cap 3 or 4 adapted to be mounted on the respective end of the cylindrical ceramic body 1 has its interior corner 3a or 4a rounded to have a predetermined radius $R_{12}$ of rounding. The radius $R_{11}$ of rounding is, in accordance with the present invention, selected to be greater than $R_{12}$ of rounding, that is, $R_{11} > R_{12}$.

Figures 2, 3:
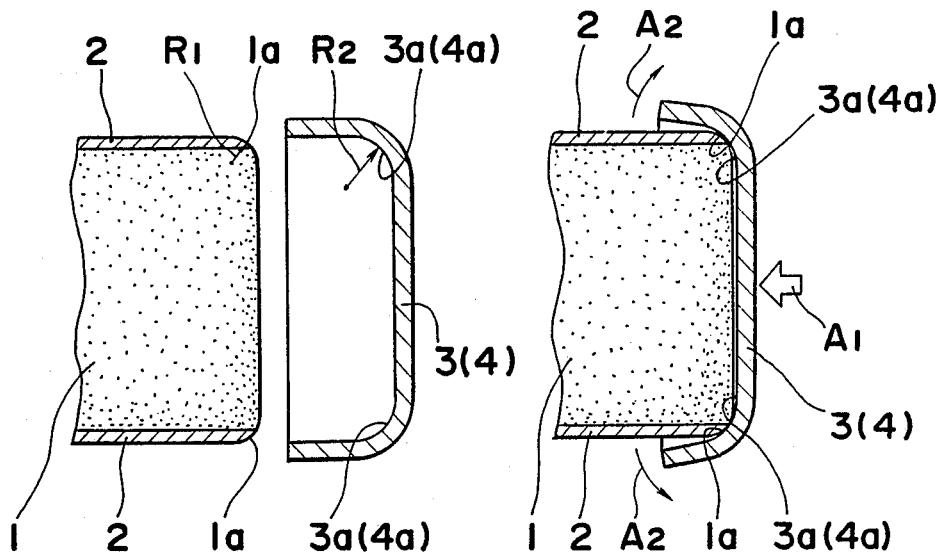
FIG. 2 is a longitudinal sectional view, on an enlarged scale, of one end portion of the ceramic resistor of FIG. 1, with a metal cap before being mounted.
FIG. 3 is a view similar to FIG. 2, with the metal cap shown as mounted.

By so designing, it will readily be seen that, as best shown in FIG. 6, when each metal cap 3 or 4 is mounted on the respective end of the ceramic body 1 by the application of an external pushing force $A_3$ acting in a direction axially of the ceramic body 1, no contact takes place between the rounded peripheral edge 1a and the respective rounded interior corner 3a or 4a, but a gap $g_0$ is formed therebetween because of the selected relationship $R_{11} > R_{12}$. Therefore, the continued application of the external pushing force $A_3$ does not result in the radially outward enlargement of the peripheral wall portion of each metal cap 3 or 4 such as occurring in the prior art resistor described with reference to and shown in FIGS. 1 to 3.

Thus, it is clear that each metal cap 3 or 4 can be firmly mounted on the respective end of the ceramic body 1 according to the present invention.

The more firm mounting of each metal cap 3 or 4 on the respective end of the ceramic body 1 can be advantageously accomplished if, as best shown in FIG. 7, the peripheral wall portion of each metal cap 3 or 4 is formed with an annular projection 3b protruding radially inwardly of the respective metal cap 3 or 4.

When the chip resistor is to be used, circuit wirings may be soldered directly to the metal caps 3 and 4. Alternately, as shown in FIG. 7, each metal cap 3 or 4 may have a lead-out wiring 6 soldered to a central region of the end wall of the respective metal cap 3 or 4 so that the lead-out wirings 6 can be connected with external circuits.

The application of the present invention to a generally cylindrical chip capacitor will now be described with reference to FIG. 8.

The chip capacitor shown in FIG. 8 comprises a tubular ceramic body 13 having its inner and outer peripheral surfaces coated with inner and outer electrode layers 11 and 12, respectively, and metal caps 14 and 15 mounted on the opposite ends of the ceramic body 13. The inner and outer electrode layers 11 and 12 are electrically separated from each other by the presence of both a gap $g_1$, defined on a portion of the outer peripheral surface of the ceramic body 13 adjacent one end thereof, and another gap $g_2$ defined on an end face of the other end of the ceramic body 13 so as to continue to a portion of the inner peripheral surface thereof adjacent said other end thereof. The inner and outer electrode layers 11 and 12 confront with each other with the intervention of the ceramic body 13, and a static capacitance can be obtained across the metal caps 14 and 15. As is the case with the chip resistor in the foregoing embodiment, the complete ceramic body 13 having the electrode layers 11 and 12 and the metal caps 14 and 15 are covered by a resin coating 16 with the metal caps 14 and 15 permitted to be exposed to the outside.

Even in this chip capacitor shown in and described with reference to FIG. 8, an outer peripheral edge 13a of each end of the ceramic body 13 is rounded to have a radius $R_{21}$ and, on the other hand, each of the metal caps 14 and 15 has an interior corner 14a or 15a rounded to have a radius $R_{22}$ of rounding, which radius $R_{21}$ of rounding is selected to be greater than the radius $R_{22}$ of rounding, that is, $R_{21} > R_{22}$. Therefore, the chip capacitor shown in FIG. 8 can exhibit effects similar to those afforded by the chip resistor shown in FIGS. 4 to 6.

Although the present invention has been fully described by way of example with reference to the accompanying drawings, it is to be noted that various changes and modifications are apparent to those skilled in the art without departing from the scope of the present invention as defined by the appended claims. By way of example, although reference has been made to the resistor and the capacitor, the present invention is applicable to any other electronic component utilizing a ceramic material.

Therefore, such changes and modifications are to be understood as included with the scope of the present invention.

What is claimed is:

1. A ceramic electronic component which comprises a generally elongated ceramic body and a metal cap mounted on each end of the ceramic body, said each end of the ceramic body having a peripheral edge rounded to have a predetermined first radius of rounding, said metal cap having an interior corner rounded to have a predetermined second radius of rounding, said first radius of rounding being greater than said second radius of rounding.

2. The component as claimed in claim 1, wherein the ceramic body is a generally cylindrical solid ceramic body.

3. The component as claimed in claim 1, wherein the ceramic body is a tubular ceramic body and wherein said peripheral edge is an outer peripheral edge.

4. A ceramic electronic component which comprises a generally elongated ceramic body having two ends, each said end having an end face; and
   a respective metal cap mounted on each said end of the ceramic body,
   each said end of the ceramic body having a peripheral edge rounded to have a predetermined first radius of rounding,
   said metal cap having an outer wall which closely surrounds said ceramic body near said end, and having an end wall defining a plane substantially perpendicular to said outer wall, said metal cap having an interior corner between said outer wall and said end wall, said interior corner being rounded to have a predetermined second radius of rounding, said first radius of rounding being greater than said second radius of rounding, and
   said end wall of said metal cap being substantially completely in contact with said end face of said cylindrical body.

5. The component as claimed in claim 4, wherein the ceramic body is a generally cylindrical solid ceramic body.

6. The component as claimed in claim 4, wherein the ceramic body is a tubular ceramic body and wherein said peripheral edge is an outer peripheral edge.

7. The component as claimed in claim 5, wherein the outer wall of the metal cap is substantially cylindrical.

* * * * *